(12) United States Patent
Ohtsuki et al.

(10) Patent No.: US 8,410,573 B2
(45) Date of Patent: Apr. 2, 2013

(54) SOI (SILICON ON INSULATOR) STRUCTURE SEMICONDUCTOR DEVICE AND METHOD OF MANUFACTURING THE SAME

(75) Inventors: Hiroshi Ohtsuki, Okazaki (JP); Mitsutaka Katada, Hoi-gun (JP); Nobuhiko Noto, Annaka (JP); Hiroshi Takeno, Annaka (JP); Kazuhiko Yoshida, Chikuma (JP)

(73) Assignees: DENSO CORPORATION, Kariya (JP); Shin-Etsu Handotai Co., Ltd., Tokyo (JP)

( * ) Notice: Subject to any disclaimer, the term of this patent is extended or adjusted under 35 U.S.C. 154(b) by 265 days.

(21) Appl. No.: 12/734,240

(22) PCT Filed: Oct. 20, 2008

(86) PCT No.: PCT/JP2008/002964
§ 371 (c)(1),
(2), (4) Date: Jul. 2, 2010

(87) PCT Pub. No.: WO2009/054115
PCT Pub. Date: Apr. 30, 2009

(65) Prior Publication Data
US 2010/0264510 A1    Oct. 21, 2010

(30) Foreign Application Priority Data

Oct. 22, 2007  (JP) ................................. 2007-273813
Oct. 8, 2008   (JP) ................................. 2008-261781

(51) Int. Cl.
*H01L 29/06*  (2006.01)
(52) U.S. Cl. .................... 257/506; 257/617; 257/E29.02

(58) Field of Classification Search .................. 257/617, 257/913, E21.317, E21.318; 438/58, 143, 438/402, 471
See application file for complete search history.

(56) References Cited

U.S. PATENT DOCUMENTS

| 5,798,294 A | 8/1998 | Okonogi |
| 6,057,036 A | 5/2000 | Okonogi |
| 6,191,450 B1 * | 2/2001 | Maeda et al. ................. 257/347 |

(Continued)

FOREIGN PATENT DOCUMENTS

| JP | A-02-260428 | 10/1990 |
| JP | A-08-018054 | 1/1996 |

(Continued)

OTHER PUBLICATIONS

Office Action dated Feb. 22, 2011 from the Chinese Patent Office in the corresponding CN patent application No. 200880112534.6 (English translation enclosed).

(Continued)

*Primary Examiner* — Zandra Smith
*Assistant Examiner* — Paul Patton
(74) *Attorney, Agent, or Firm* — Posz Law Group, PLC (57) ABSTRACT

In a SOI structure semiconductor device using a SOI substrate, a lattice distortion layer is formed by implanting Ar ions into a silicon substrate as an active layer. The lattice distortion layer is capable of serving as a gettering site. The dose amount of Ar ions is adjusted in such a manner that tensile stress in the lattice distortion layer is equal to or greater than 11 MPa and equal to or less than 27 MPa. Thus, the lattice distortion layer can prevent occurrence of a leakage current while serving as the gettering site.

13 Claims, 9 Drawing Sheets

U.S. PATENT DOCUMENTS

| | | | |
|---|---|---|---|
| 6,255,195 | B1 | 7/2001 | Linn et al. |
| 6,524,928 | B1 | 2/2003 | Hirabayashi |
| 6,774,454 | B2 | 8/2004 | Hirabayashi |
| 7,052,973 | B2 | 5/2006 | Linn et al. |
| 7,394,129 | B2 * | 7/2008 | Graf et al. .................... 257/347 |
| 8,268,705 | B2 | 9/2012 | Yoshida et al. |
| 2006/0175613 | A1 * | 8/2006 | Lee et al. ........................ 257/65 |
| 2009/0111242 | A1 * | 4/2009 | Akiyama et al. .............. 438/458 |

FOREIGN PATENT DOCUMENTS

| | | |
|---|---|---|
| JP | A-08-078644 | 3/1996 |
| JP | A-H10-032209 | 2/1998 |
| JP | A-H11-067778 | 3/1999 |
| JP | B2-3484961 | 10/2003 |
| JP | A-2006-134925 | 5/2006 |
| JP | A-2007-095951 | 4/2007 |
| JP | A-2007-157935 | 6/2007 |
| JP | A-2008-041830 | 2/2008 |

OTHER PUBLICATIONS

International Search Report and Written Opinion of the International Searching Authority mailed on Jan. 13, 2009 for the corresponding international patent application No. PCT/JP2008/002964(English translation enclosed).

Extended European Search Report mailed Jan. 4, 2013 in corresponding EP Application No. 08841352.1.

* cited by examiner

SOI (SILICON ON INSULATOR) STRUCTURE SEMICONDUCTOR DEVICE AND METHOD OF MANUFACTURING THE SAME

CROSS REFERENCE TO RELATED APPLICATIONS

This application is a U.S. national stage application of PCT/JP2008/002964 filed on Oct. 20, 2008 and is based on and incorporates herein by reference Japanese Patent Application No. 2007-273813 filed on Oct. 22, 2007 and No. 2008-261781 filed on Oct. 8, 2008.

TECHNICAL FIELD

The present invention relates to a SOI structure semiconductor device formed by using a SOI substrate having a SOI layer (active layer) disposed through a silicon oxide film on a surface of a silicon substrate as a supporting substrate, and relates to a method of manufacturing the same.

BACKGROUND ART

For example, Japanese Patent No. 3484961, Japanese Patent Application Publication No. H2-260428, and Japanese Patent No. 2908150 conventionally disclose techniques for performing gettering of heavy metal impurities, due to a substrate and a process, in a SOI substrate or a SOI structure semiconductor device.

Japanese patent No. 3484961 discloses that a polycrystalline silicon thin film is used for gettering. Specifically, the polycrystalline silicon thin film is formed on a surface of a silicon substrate that is used for a supporting substrate. Further, an oxide film is formed on a surface of another silicon substrate that is used for an active layer, and H ions are implanted into the other substrate. Then, after the silicon substrates are bonded together, the other substrate is removed with respect to a portion where the H ions are implanted. Thus, a SOI substrate having the polycrystalline silicon thin film located between the buried oxide film and the supporting substrate is formed. In the SOI substrate having the polycrystalline silicon thin film, the polycrystalline silicon thin film is used for gettering.

In Japanese Patent Application Publication No. H2-260428, gettering of heavy metal impurities in an active layer is performed by a polycrystalline silicon thin film that is formed between the active layer and a buried oxide film. In Japanese Patent No. 2908150, a region where Si or P ions are implanted with $1 \times 10^{15}/cm^2$ or more is formed near a buried oxide film in an active layer, and gettering of heavy metal impurities in the active layer is performed by the region.

However, the method disclosed in Japanese patent No. 3484961 has no effect on heavy metal impurities, such as Fe or Ni, having a slow rate of diffusion into an oxide film, because diffusion of impurities into a supporting substrate is blocked by a buried oxide film so that the impurities will be trapped in the active layer.

Further, according to the methods disclosed in Japanese Patent Application Publication No. H2-260428 and Japanese Patent No. 2908150, the polycrystalline silicon thin film or the Si ion-implanted region is used for gettering. Therefore, when a depletion layer in a PN junction in the active layer extends to a gettering region, a leakage current may occur due to crystal grain boundary of the polycrystalline silicon thin film or a defect induced by a lot of point defects resulting from the Si ion implantation. If a region where P ions are implanted with $1 \times 10^{15}/cm^2$ or more is used, the depletion layer extends to a short distance because the ion-implanted region is of $n^+$-type. However, device characteristics may vary.

DISCLOSURE OF THE INVENTION

In view of the above, it is an object of the present invention to provide a SOI structure semiconductor device for effectively performing gettering, for reducing a leakage current, and for preventing variations in device characteristics. It is an object of the present invention to provide a method of manufacturing the SOI structure semiconductor device.

In order to achieve the above object, according to the present invention, a SOI structure semiconductor device includes a SOI substrate having a silicon substrate of monocrystalline silicon, a first conductivity type active layer of monocrystalline silicon, and a buried insulation layer between the silicon substrate and the active layer. A second conductivity type layer are located in a surface portion of the active layer to form a PN junction with the active layer. A silicon crystalline lattice of the active layer is distorted to form a lattice distortion layer serving as a gettering site.

In this way, the SOI structure semiconductor device is formed by using the SOI substrate, and the lattice distortion layer is formed in the active layer. Thus, the lattice distortion layer can effectively serve as a gettering site.

For example, when a thickness of the active layer is defined as X [µm], and a thickness of the buried insulation layer is defined as Y [µm], a lower limit of an internal stress in the lattice distortion layer can be determined to satisfy the following expression:

Internal stress [MPa]$\geq |-0.78X+22.8Y-18.5|$

In such an approach, the lattice distortion layer can effectively serve as a gettering site.

Preferably, when a thickness of the active layer is defined as X [µm], and a thickness of the buried insulation layer is defined as Y [µm], an upper limit of an internal stress in the lattice distortion layer can be determined to satisfy the following expression:

Internal stress [MPa]$\leq |-0.78X+22.8Y-34.5|$

In such an approach, a leakage current due to a defect induced by stress can be prevented. The internal stress is expressed as an absolute value, because tensile stress is expressed as a negative (−) value of the internal stress, and compressive stress is expressed as a positive (+) value of the internal stress.

For example, when a thickness of the active layer is 5 µm, and a thickness of the buried insulation layer is 0.5 µm, the internal stress in the lattice distortion layer can be equal to or greater than 11 MPa.

Further, when a thickness of the active layer is 5 µm, and a thickness of the buried insulation layer is 0.5 µm, the internal stress in the lattice distortion layer can be equal to or less than 27 MPa.

When the lattice distortion layer is analyzed by a cathodoluminescence technique, a peak value of an emission intensity at a wavelength λ of 1535 nm is defined as a D1 line peak intensity, and the peak value of the emission intensity at the wavelength λ of 1130 nm is defined as a T0 line peak intensity. In this case; it is preferable that a ratio of the D1 line peak intensity to the T0 line peak intensity should be equal to or less than 1/3 . For example, the ratio of the D1 line peak intensity to the T0 line peak intensity can be 1/3 by adjusting the dose amount of Ar ions when the lattice distortion layer is formed. In such an approach, stress occurring in the lattice distortion layer is adjusted so that a leakage current can be reduced.

When the lattice distortion layer is analyzed by a cathodoluminescence technique, a peak value of an emission intensity at a wavelength λ of 1279 nm is defined as a Gcenter line peak intensity, and the peak value of the emission intensity at the wavelength λ of 1130 nm is defined as a T0 line peak intensity. In this case, a ratio of the Gcenter line peak intensity to the T0 line peak intensity can be equal to or less than 5/7. In such an approach, the leakage current can be reduced.

Further, an average diameter of a crystal defect in the lattice distortion layer can be equal to or less than 15 nm. In such an approach, occurrence of the leakage current can be prevented, because it can be considered that dislocation does not occur when the average diameter of the crystal defect is equal to or less than 15 nm. Preferably, the average diameter of the crystal defect in the lattice distortion layer should be greater than 0 nm and equal to or less than 15 nm.

Further, in a case where a second conductivity type well layer is formed in a device-forming region of the active layer, it is preferable that an impurity diffusion region where boron is diffused is formed in a non-device forming region of the active layer in addition to the lattice distortion layer. In such an approach, gettering of metal impurities that are likely to be segregated into the boron diffusion region can be performed. Therefore, even when the lattice distortion layer cannot perform gettering of all Fe impurities, the impurity diffusion region can prevent Fe from being concentrated into the well layer of p-type. Thus, the quality of the gate oxide film on the well layer can be improved, and a junction leakage current between the active layer and the well layer can be reduced.

In this case, if the well layer is of p-type, it is preferable that a p-type impurity concentration of the impurity diffusion region should be greater than that of the well layer. In such an approach, the effect of gettering of metal impurities that are likely to be segregated into the boron diffusion region can be improved. For example, it is preferable that a boron impurity concentration of the impurity diffusion region should be equal to or greater than $1 \times 10^{18}$ cm$^{-3}$.

Further, a method of manufacturing the above SOI structure semiconductor device can include a step of performing a sacrifice oxidation before forming a gate oxide film. In the sacrifice oxidation, an oxide film is formed by thermal oxidation and then removed by using a dilute HF. A byproduct generated in production of a LOCOS oxidation film can be removed by performing such a sacrifice oxidation. Further, metal impurities, such as Fe, that are likely to be segregated into an oxide layer can be removed before the gate oxide layer is formed. Therefore, a quality of the gate oxide film to be formed thereafter can be improved.

The symbol in parentheses of each means described above corresponds to a specific means described in embodiments described later.

BRIEF DESCRIPTION OF THE DRAWINGS

The above and other objectives, features and advantages of the present invention will become more apparent from the following detailed description made with check to the accompanying drawings. In the drawings.

PREFERRED EMBODIMENTS OF THE INVENTION

An embodiment of the present invention is described below with reference to the drawings. In the drawings, the same symbols designate the same or corresponding portions.

(First Embodiment)

Figure 1:
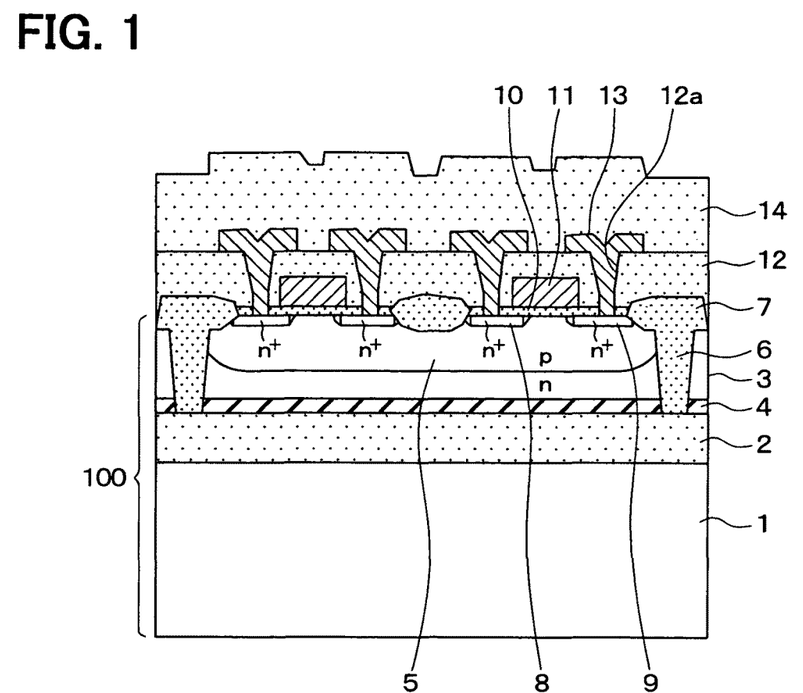
FIG. 1 is a cross-sectional view of a SOI structure semiconductor device according to a first embodiment of the present invention.

A first embodiment of the present invention is described. FIG. 1 is a cross-sectional view of a SOI structure semiconductor device according to the present embodiment. The SOI structure semiconductor device of the present embodiment is described with reference to this figure.

A SOI substrate 100 is formed as shown in FIG. 1. A buried insulation layer 2 made of silicon dioxide film and having a thickness of from 0.1 μm to several μm is formed on a monocrystal silicon substrate 1 as a supporting substrate. A n-type active layer 3 made of monocrystal silicon and having a thickness of from 1 μm to several μm is formed on the buried insulation layer 2. A lattice distortion layer 4 as a gettering site is formed in the active layer 3. The lattice distortion layer 4 is formed by lattice distortion in silicon of the active layer 3. The lattice distortion layer 4 is described in detail later.

A p-type well layer (impurity diffusion layer) 5 having a different conductivity than the active layer 3 is formed in a surface portion of the active layer 3. The n-type active layer 3 and the p-type well layer 5 form a PN junction.

A trench isolation structure 6 and a LOCOS oxide film 7 are located around the p-type well layer 5 to isolate devices from each other. An n$^+$-type source region 8 and an n$^+$-type drain region 9 are formed in a surface portion of the isolated p-type well layer 5 in such a manner that they are spaced from each other.

The surface portion of the p-type well layer 5 between the n$^+$-type source region 8 and the n$^+$-type drain region 9 is defined as a channel region, and a gate oxide film 10 is formed on the channel region. A gate electrode 11 made of doped poly-Si is formed on the gate oxide film 10. An interlayer insulation film 12 is formed to cover the gate electrode 11 and the gate oxide film 10. A contact hole 12a is formed to penetrate the interlayer insulation film 12 and the gate oxide film 10. A wire 13 is connected to the $n^+$-type source region 8 and the $n^+$-type drain region 9 through the contact hole 12a, separately. A passivation film 14 is formed to cover the wire 13 and the interlayer insulation film 12. In this way, in the SOI structure semiconductor device, a MOSFET is formed in the SOI substrate 100 having PN junction.

Next, a method of making the SOI structure semiconductor device according to the present embodiment is described. FIGS. 2A-2F are cross-sectional views illustrating processes of making the SOI substrate 100. FIGS. 3A-3E are cross-sectional views illustrating processes of making the SOI structure semiconductor device shown in FIG. 1 by using the SOI substrate 100 made by the processes shown in FIG. 2. Below, with reference to these figures, a method of making the SOI structure semiconductor device is described, after a method of making the SOI substrate 100 is described.

Firstly, the method of making the SOI substrate 100 is described.

Figure 2A:
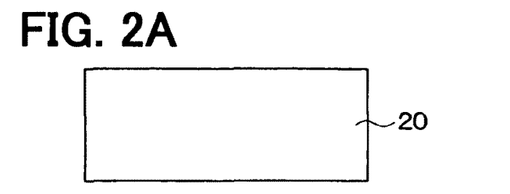
FIGS. 2A-2F are cross-sectional views illustrating processes of manufacturing a SOI substrate 100 used for the SOI structure semiconductor device shown in FIG. 1.

(Process Shown in FIG. 2A)

A monocrystal silicon substrate 20 for the active layer 3 where a device is formed is prepared. Examples of the silicon substrate 20 can include a n-type CZ silicon substrate (dopant: phosphorus) having a crystal plane orientation <100> and having a resistivity of from 1 Ωcm to 50 Ωcm.

Figure 2B:
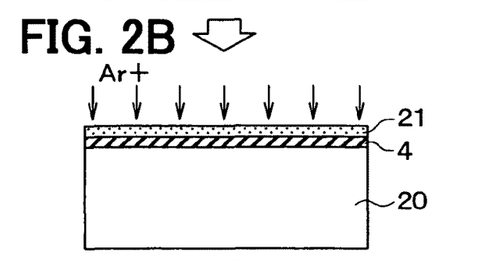

(Process Shown in FIG. 2B)

The lattice distortion layer 4 serving as a gettering site is formed at a predetermined depth in the silicon substrate 20. For example, a thermally oxidized film 21 is formed on a surface of the silicon substrate 20 by thermal oxidation, and then ion implantation of Ar ions is performed by application of a voltage of 200 keV or less (e.g., 100 keV). For example, the amount of Ar ions to be implanted is equal to or greater than $5 \times 10^{12}/cm^2$ and less than $3 \times 10^{14}/cm^2$ (e.g., $1 \times 10^{14}$ atoms/$cm^2$).

Figure 4:
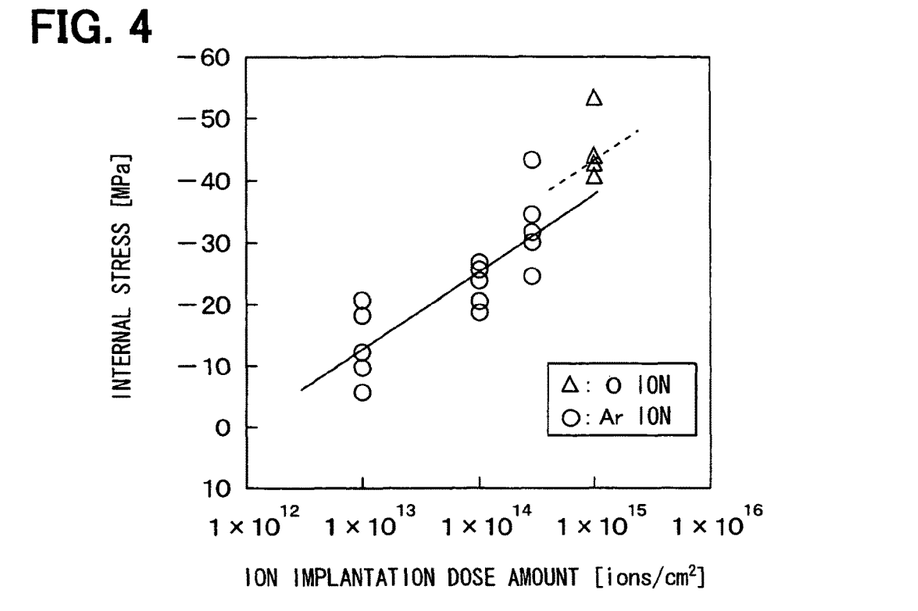
FIG. 4 is a graph illustrating a relationship between an internal stress in a lattice distortion layer 4 and the dose amount of implanted ions and a type of the implanted ions.

Distortion occurs in silicon crystal lattice due to damage by the Ar ion implantation so that the lattice distortion layer 4 can be formed. As shown in FIG. 4, the internal stress in the lattice distortion layer 4 varies depending on the dose amount and the type of an element for ion implantation. Therefore, the internal stress can be adjusted within a suitable range. Specifically, an neutral element that is electrically inert in silicon is used for ion implantation in order to avoid effect on characteristics of a device formed in the active layer 3. For example, besides Ar, any one of or a combination of the following elements can be used for ion implantation: He, Ne, Kr, Xe, C, O, Si. In summary, the lattice distortion layer 4 of the present embodiment means a region where silicon crystal lattice is distorted due to implantation of atoms, such as Ar ions, that is electrically inert in silicon.

Figure 2C:
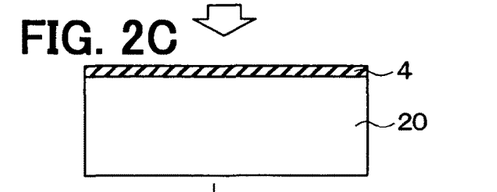

(Process Shown in FIG. 2C)

The thermally oxidized film 21 is removed by etching by soaking the silicon substrate 20 in dilute hydrofluoric acid solution.

Figure 2D:
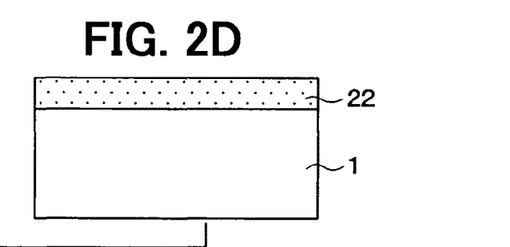

(Process Shown in FIG. 2D)

A silicon substrate 1 made of monocrystal silicon and having surface area equal to surface area of the silicon substrate 20 is prepared for a supporting substrate. An oxide film 22 having a thickness of from 0.1 μm to 5.0 μm, preferably, from 0.5 μm to 3.0 μm is formed on a surface of the silicon substrate 1 by thermal oxidation.

Figure 2E:
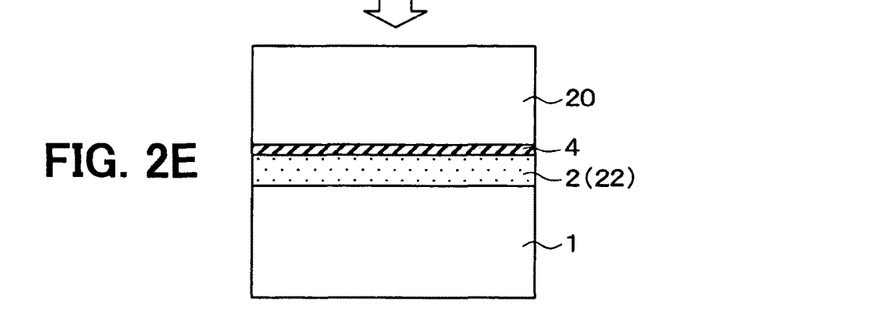

(Process Shown in FIG. 2E)

The silicon substrate 20 with the lattice distortion layer 4 and the silicon substrate 1 with the oxide film 22 are cleaned by a SC1 cleaning solution, and then the two substrates 1, 20 are placed one on top of another in such a manner that the silicon surface on the lattice distortion layer 4 side and the oxide film 22 can be in close contact with each other. Then, the two substrates are thermally treated in oxygen or nitrogen atmosphere at a temperature of 900 to 1200° C. for 30 to 120 minutes so that the two substrates can be tightly joined together through the silicon surface and the oxide film 22. In this way, the oxide film 22 is buried between the silicon substrates 1, 20 so as to form the buried insulation layer 2.

Figure 2F:
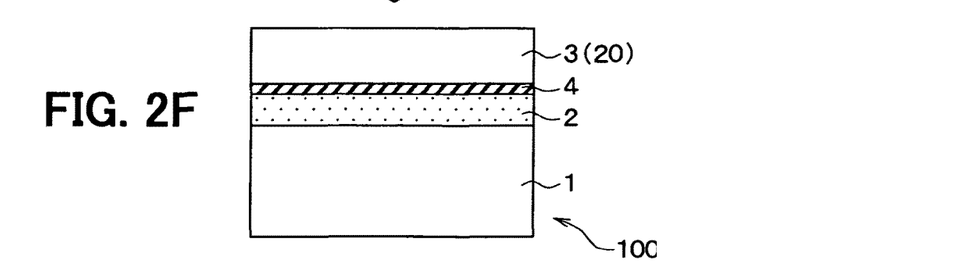

(Process Shown in FIG. 2F)

The surface of the silicon substrate 20 with the lattice distortion layer 4 is polished and planarized so that the silicon substrate 20 can have a thickness of 0.5 to several tens of μm, preferably 5 to 20 μm. Thus, the silicon substrate 20 is formed into the active layer 3. In this way, the SOI substrate 100 is completed. Then, the SOI structure semiconductor device is made by using this SOI substrate 100. As described above, according to the present embodiment, the oxide film 22 on the silicon substrate as a supporting substrate is formed into the buried insulation layer 2. Alternatively, the thermally oxidized film 21 on the silicon substrate 20, which is to be formed into the active layer 3, can be formed into the buried insulation layer 2. Alternatively, oxide films 22 can be formed on both silicon substrates 1, 20 and joined together to form the buried insulation layer 2.

Next, the method of making the SOI structure semiconductor device is described with reference to FIGS. 3A-3E.

Figure 3A:
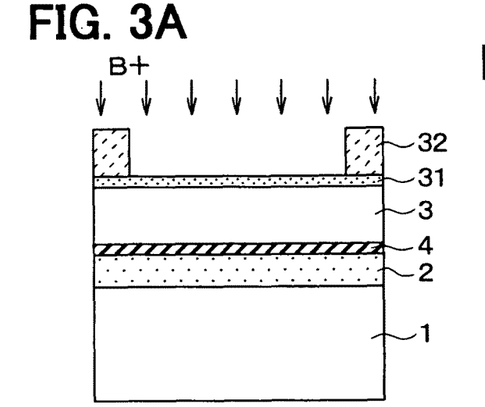
FIGS. 3A-3E are cross-sectional views illustrating processes of manufacturing the SOI structure semiconductor device shown in FIG. 1 by using the SOI substrate 100 manufactured by the processes shown in FIGS. 2A-2F.

(Process Shown in FIG. 3A)

A thermally oxidized film 31 having a thickness of about 40 nm is formed to cover a surface of the active layer 3, and a photoresist 32 is formed on the thermally oxidized film 31. In a photolithography process, an opening is formed in the photoresist 32 at a position corresponding to the p-type well layer 5. Then, for example, boron ions are selectively implanted with a dose of $2 \times 10^{13}$ $cm^{-2}$ at an energy of 240 keV by using the photoresist 32 as a mask.

Figures 3B, 3C, 3E:
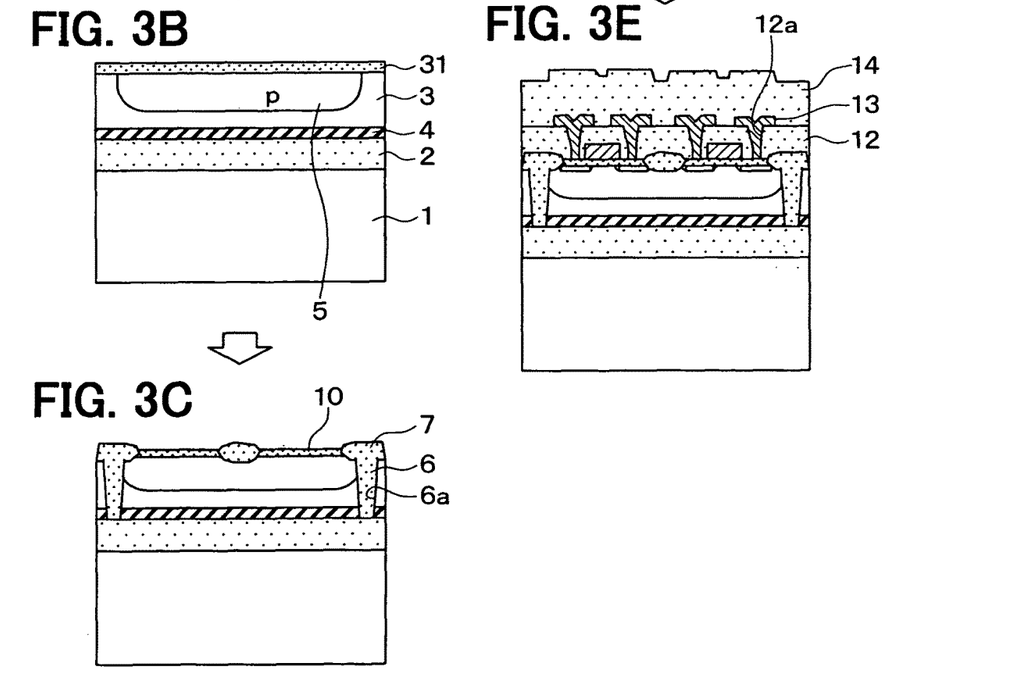

(Process Shown in FIG. 3B)

After a remaining portion of the photoresist 32 is removed, a thermal treatment is performed in nitrogen atmosphere, for example, at a temperature of 1150° C. for 90 minutes. Thus, the implanted boron ions are diffused so that the p-type well layer 5 can be formed. Although not shown in the drawings, if a CMOS is formed in the SOI substrate 100, a n-type well layer is formed in the same manner as the p-type well layer 5. For example, after a photoresist (not shown) is formed, an opening is formed in the photoresist at a position corresponding to the n-type well layer in a photolithography process. Then, for example, phosphorus ions are implanted with a dose of $8 \times 10^{12}$ $cm^{-2}$ at an energy of 500 keV by using the photoresist as a mask. Then, after a remaining portion of the photoresist is removed, a thermal treatment is performed in nitrogen atmosphere, for example, at a temperature of 1000° C. for 30 minutes. Thus, the phosphorus ions are diffused so that the n-type well layer 5 can be formed.

(Process Shown in FIG. 3C)

A $Si_3N_4$ film (not shown) having a thickness of about 150 to 200 nm is formed on the thermally oxidized film 31 by a LP-CVD method. A photoresist (not shown) is formed on the $Si_3N_4$ film. Then, in a photolithography process, an opening is formed in the photoresist at a position corresponding to a trench isolation structure 6. Then, by using the photoresist, the $Si_3N_4$ film and the thermally oxidized film 31 are selectively removed by dry etching. In this way, the $Si_3N_4$ film and the thermally oxidized film 31 are selectively removed so that the active layer 3 can be exposed in such a manner that device-forming regions are isolated from each other.

Then, a trench 6a is formed by dry etching the active layer 3 using the $Si_3N_4$ film as a mask. Then, as necessary, chemical dry etching is performed to remove an etching-damaged layer on a surface of the trench 6a. Then, a thermally-oxidized film having a thickness of about 100 nm is formed on a side wall and a bottom of the trench 6a. Then, a CVD film is formed to fill the trench so that the trench isolation structure 6 can be formed. Examples of the CVD film can include a non-doped polysilicon film, a P-doped polysilicon film, a B-doped polysilicon film, an oxide film, and a nitride film. Examples of making the CVD film can include a LP-CVD, a plasma CVD, and a normal pressure CVD.

Then, a LOCOS oxide film 7 is formed by a so-called LOCOS oxidation method. Specifically, after a photoresist is formed, an opening is formed in the photoresist at a position corresponding to the LOCOS oxide film 7 by a photolithography process. Then, the $Si_3N_4$ film is selectively removed by a dry etching using the photoresist as a mask, so that the thermally-oxidized film can be exposed. Then, after a remaining portion of the photoresist is removed, a thermal oxidation is performed by using the $Si_3N_4$ film as a mask in water vapor atmosphere, for example, at a temperature of 1000° C. for 400 to 500 minutes. In this way, the LOCOS oxide film 7 is formed.

Then, the $Si_3N_4$ film is removed by etching using phosphoric acid, and the thermally-oxidized film is removed by using a dilute HF. Then, a thermal oxidation is performed in water vapor atmosphere, for example, at a temperature of 850° C. to form a gate oxide film 10 having a predetermined thickness. In this case, a sacrifice oxidation can be performed before forming the gate oxide film 10. In the sacrifice oxidation, for example, a thermal oxidation is performed at a temperature of 1000° C. to form an oxide layer having a thickness of 40 nm, and then the oxide layer is removed by using a dilute HF. A byproduct generated in production of the LOCOS oxide film 7 can be removed, and metal impurities, such as Fe, that are likely to be segregated into an oxide layer can be removed before the gate oxide layer is formed. Therefore, a quality of the gate oxide film 10 to be formed thereafter can be improved.

Figure 3D:
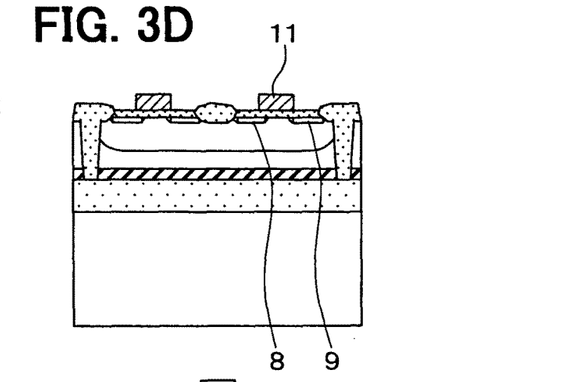

(Process Shown in FIG. 3D)

After a doped poly-Si film is formed, a gate electrode 11 is formed by patterning the doped poly-Si film. Specifically, after a photoresist is formed on the doped poly-Si film, the photoresist is partially removed by a photolithography process in such a manner that the photoresist can be left at a position corresponding to the gate electrode. Then, a dry etching is performed by using the photoresist as a mask so that the doped poly-Si film can be selectively left at a position. In this way, the gate electrode 11 is formed. Further, ion implantation of impurities of a different conductivity than the well is performed by using the gate electrode 11 as a mask. Then, a thermal treatment is performed in nitrogen atmosphere so that a $n^+$-type source region 8 and a $n^+$-type drain region 9 can be formed. In this way, a N channel MOSFET is formed.

Although not shown in the drawings, a P channel MOSFET is formed in the n-type well layer in the same manner.

(Process Shown in FIG. 3E)

After the interlayer insulation film 12 is formed on the entire substrate surface including the gate electrode 11, the contact hole 12a is formed in the interlayer insulation film 12 by a photolithography process. Then, a metal layer is formed on the interlayer insulation film 12 and patterned into the wire 13 that is electrically connected through the contact hole 12a to the gate electrode 11, the $n^+$-type source region 8, and the $n^+$-type drain region 9. Then, the passivation film 14 is formed so that the SOI structure semiconductor device can be completed.

Then, an evaluation of internal stress in the SOI structure semiconductor device was conducted. Specifically, the semiconductor device was cleaved in a thickness direction, and internal stress on a cleavage surface was evaluated by micro-Raman spectroscopy.

Further, an evaluation of gettering capability of the semiconductor device was conducted as follows. Firstly, in the process shown in FIG. 2F, the SOI substrate 100 with the lattice distortion layer 4 was thermally treated in nitrogen atmosphere at a temperature of 1150° C. for 350 minutes in the same manner as the high temperature thermal treatment performed in the device making process. Then, Ni was applied to a surface of the active layer 3 with a concentration of about $5 \times 10^{12}$ atoms/cm² and diffused inside by performing a thermal treatment in nitrogen atmosphere at a temperature of 1000° C. for 1 hour.

Then, the oxide film on the surface of the active layer 3, the active layer 3, and the buried insulation layer (BOX (Buried Oxide) layer) 2, and a supporting substrate surface layer (within about 1 μm from an interface with the buried insulation layer 2) were gradually etched, and the distribution of the concentration of Ni in the thickness direction was measured by measuring the concentration of Ni in the solution by ICP-MS. Specifically, each of the surface oxide layer and the buried insulation layer 2 was measured in one stage using a HF solution, the active layer 3 was measured using a mixed acid solution by dividing the active layer 3 in five stages at about 1 μm interval, and the supporting substrate surface layer was measured in one stage using a mixed acid solution. Further, the same evaluation, except that the thermal treatment in nitrogen atmosphere at a temperature of 1150° C. for 350 minutes was performed before Ni was applied, was conducted to observe the effect of the high temperature thermal treatment, performed in the device making process, on the gettering capability. As a result, there was no difference in the gettering capability.

In addition, an evaluation of junction leakage current of the semiconductor device was conducted as follows. The n-type silicon substrate 1 was grounded. A reverse voltage is applied between the silicon substrate 20 and the p-type well layer 5 by applying a negative voltage to the p-type well layer 5. The leakage current was evaluated under a condition where a voltage of the p-type well layer 5 is minus 40 V so that a depletion layer in the active layer 3 can surely extend to the lattice distortion layer 4.

Figure 5:
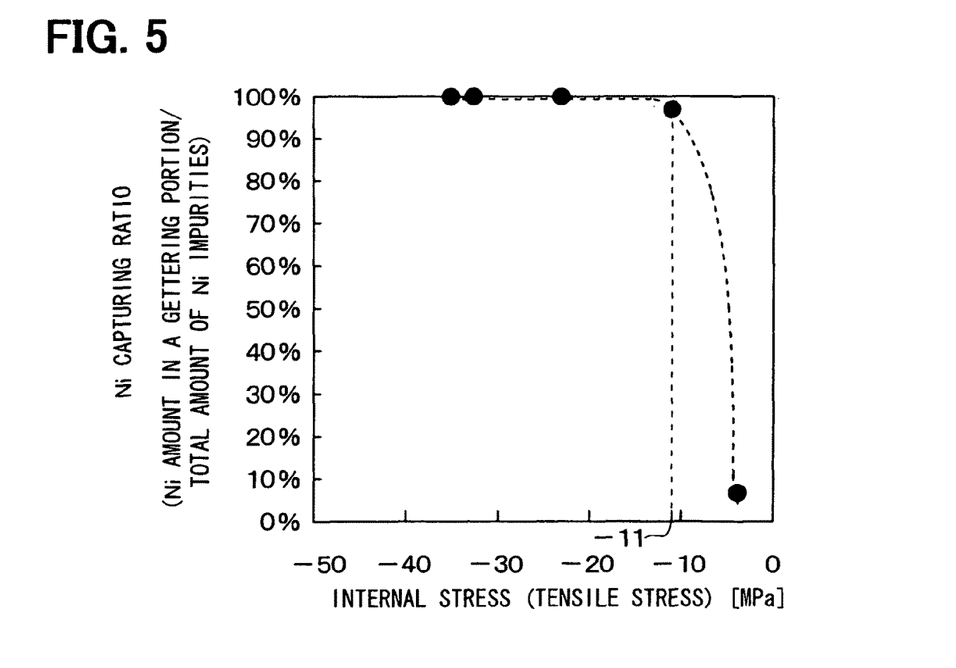
FIG. 5 is a graph illustrating a relationship between the internal stress and a guttering capability of the lattice distortion layer 4.

FIG. 5 is a graph illustrating a relationship between the gettering capability of the lattice distortion layer 4 and the internal stress under a condition where the thickness of the active layer 3 is 5 μm, and the thickness of the buried insulation layer 2 is 0.5 μm. In this figure, a longitudinal axis represents a Ni capturing ratio that is defined as a ratio of the total amount of Ni impurities (the sum of the concentration of Ni in a region from the oxide film on the surface of the active layer 3 to the surface layer of the silicon substrate 1 as a supporting substrate) within with respect to the concentration of Ni in the lattice distortion layer 4 (a region within about 2 μm from the surface of the active layer 3 on the buried insulation layer 2 side). It can be seen from this figure that a sufficient gettering capability can be obtained when tensile stress is 11 MPa or more.

Figure 6:
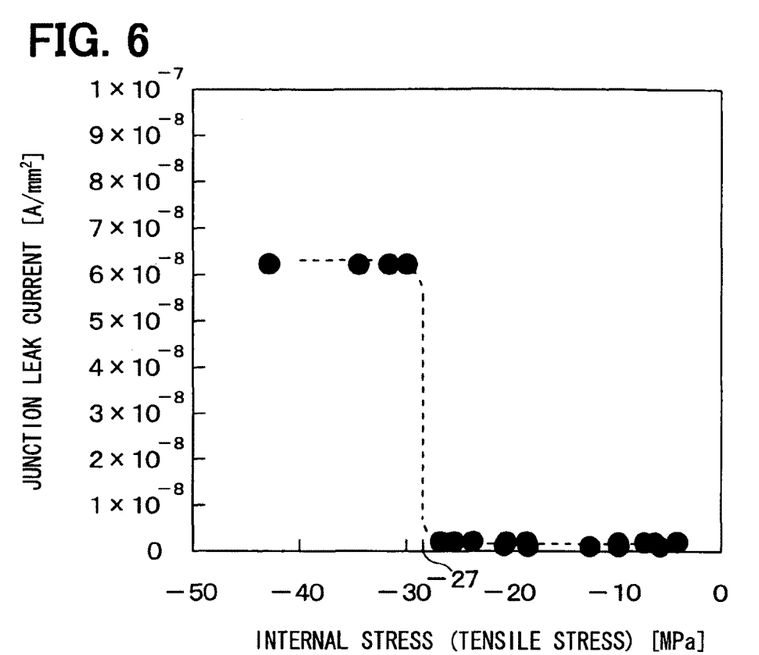
FIG. 6 is a graph illustrating a relationship a junction leak current in the lattice distortion layer 4 and the internal stress.

FIG. 6 is a graph illustrating a relationship between the junction leakage current in the lattice distortion layer 4 and the internal stress under a condition where the thickness of the active layer 3 is 5 μm, and the thickness of the buried insulation layer 2 is 0.5 µm. It can be seen from this figure that the leakage current occurs when tensile stress exceeds 27 MPa or more. It can be considered that the leakage current is due to a stress-induced defect that is induced by occurrence of large tensile stress. Therefore, reducing the tensile stress to 27 MPa or less can prevent the leakage current due to the stress-induced defect.

Figure 7:
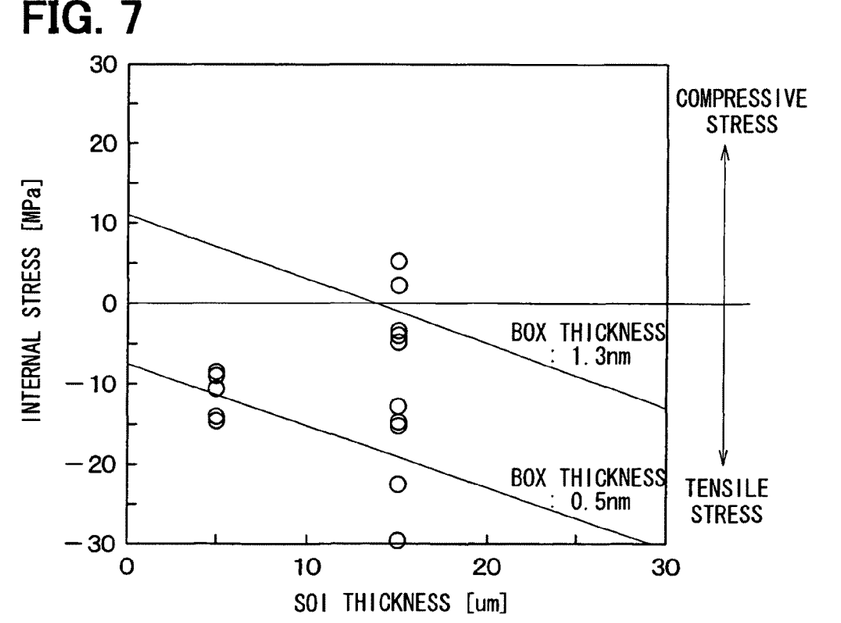
FIG. 7 is a graph illustrating a relationship between the internal stress and a thickness (BOX thickness) of a buried insulation layer 2 under a condition that a thickness (SOI thickness) of an active layer 3 is 5 μm or 15 μm.

It is noted that the graphs illustrated in FIGS. 5, 6 are based on the conditions that the thickness of the active layer 3 is 5 µm and that the thickness of the buried insulation layer 2 is 0.5 µm. Therefore, if these thicknesses are changed, the lower limit of the tensile stress for the gettering capability and the upper limit of the tensile stress effective for prevention of the leakage current due to the stress-induced defect are changed. FIG. 7 is a graph illustrating a relationship between the internal stress and the thickness (BOX thickness) of the buried insulation layer 2 under a condition that the thickness (SOI thickness) of the active layer 3 is 5 µm or 15 µm. A positive value (+) of the internal stress represents compressive stress, and a negative value (−) of the internal stress represents tensile stress.

As can be seen from this figure, even when the thickness of the active layer 3 is kept constant, if the thickness of the buried insulation layer 2 varies, internal stress acting between these varies. Therefore, in order to reduce the leakage current and allow the lattice distortion layer 4 to serve as a gettering site even if the internal stress varies, there is a need to determine the lower limit of the tensile stress for the lattice distortion layer 4 by taking into consideration these internal stress. From the examination result, it was confirmed that downward-sloping graphs can be drawn, for example, when the thickness of the buried insulation layer 2 is 0.5 µm and 1.3 µm. From the graphs, the internal stress can be defined by the following first expression. In the first expression, X represents the thickness [µm] of the active layer 3, and Y represents the thickness [µm] of the buried insulation layer 2.

Internal stress [MPa]=−0.78X+22.8Y−18.5     (First expression)

Therefore, the gettering capability can be surely obtained by setting the lower limit of the tensile stress in the lattice distortion layer 4 equal to or greater than the internal stress defined by the above expression. That is, the gettering capability can be surely obtained by satisfying the following second expression. The internal stress is expressed as an absolute value, because the tensile stress is represented as a negative value (−) of the internal stress.

Tensile stress in the lattice distortion layer 4
[MPa]≧|−0.78X+22.8Y−18.5|     (Second expression)

The same holds true for the upper limit of the tensile stress in the lattice distortion layer 4. That is, the leakage current can be effectively prevented by satisfying the following third expression. It is noted that the third expression is derived from the second expression by taking into consideration a difference between the lower limit of 11 MPa and the upper limit of 27 MPa when the thickness of the active layer 3 is 5 µm, and the thickness of the buried insulation layer 2 is 0.5 µm.

Tensile stress in the lattice distortion layer 4
[MPa]≦|−0.78X+22.8Y−34.5|     (Third expression)

Figure 8A:
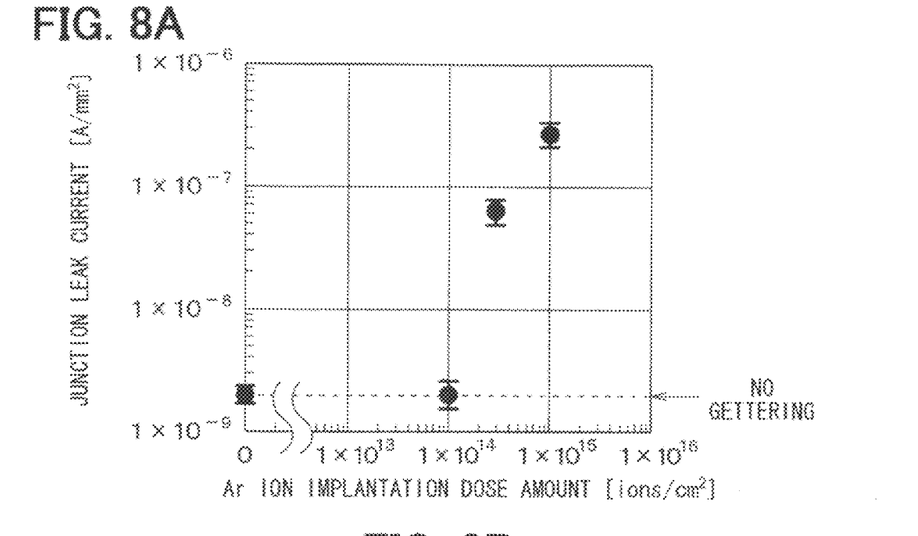
FIG. 8A is a graph illustrating a relationship between the dose amount of Ar ions and the leakage current in a PN junction.
Figure 8B:
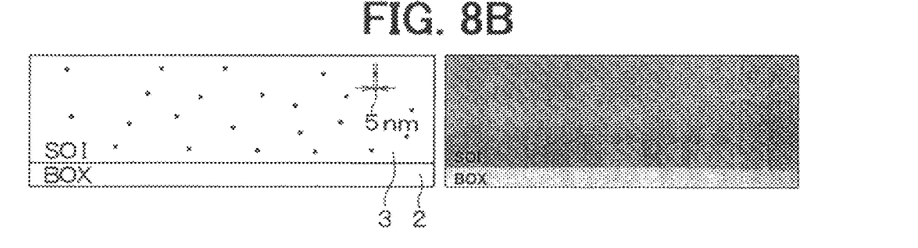
FIGS. 8B-8D are diagrams illustrating relationships between the dose amount of Ar ions and the size of a crystal defect in the lattice distortion layer 4.
Figure 8C:
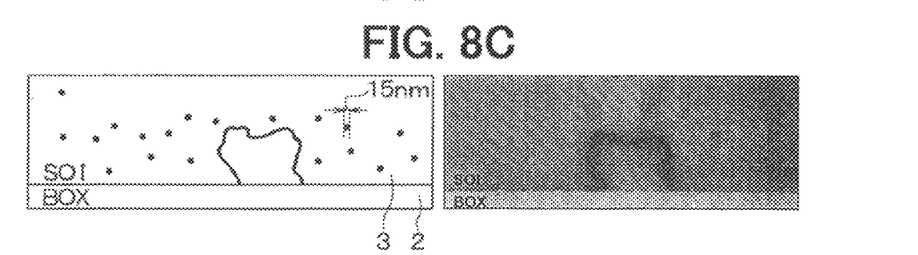
Figure 8D:
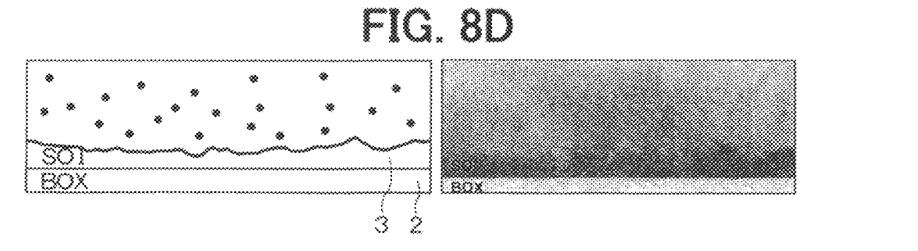
Figure 9A:
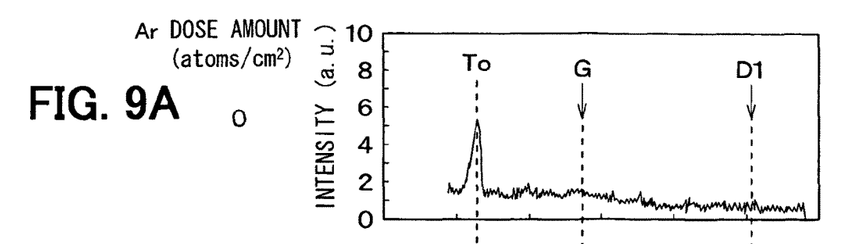
FIGS. 9A-9E are diagrams illustrating a result of a cathodoluminescence analysis conducted to measure a relationship between a wavelength λ and an emission intensity by changing the dose amount of Ar ions.
Figure 9B:
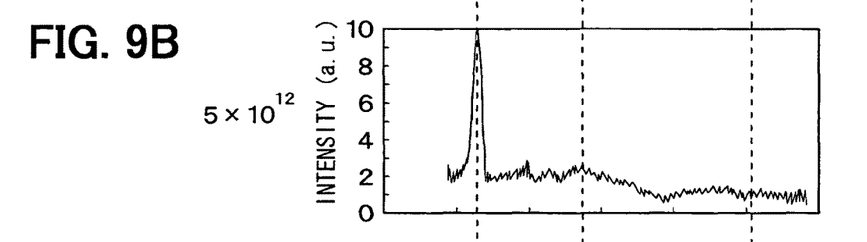
Figure 9C:
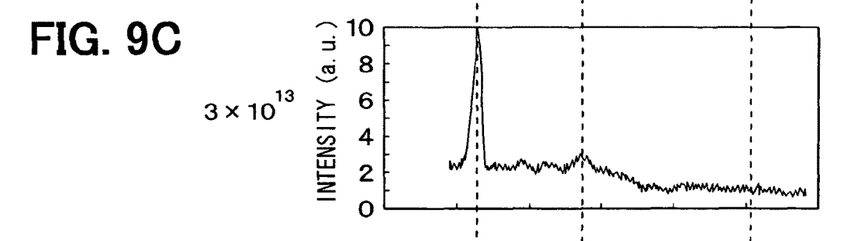
Figure 9D:
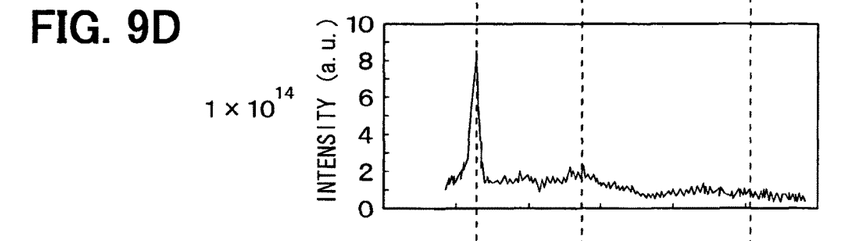
Figure 9E:
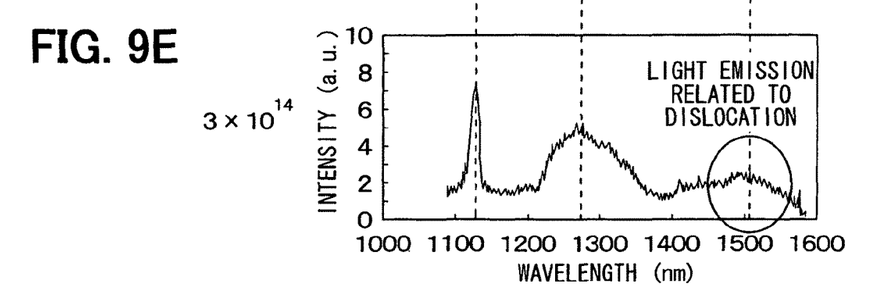

Furthermore, a relationship between crystal defect and the leakage current in a PN junction was studied as follows. The size of the crystal defect in the lattice distortion layer 4 was adjusted by changing the dose amount of Ar ions, and a relationship between the size of the crystal defect and the leakage current in the PN junction was studied. FIGS. 8A-8D are diagrams illustrating a result of the study. FIG. 8A is a graph illustrating a relationship between the dose amount of Ar ions and the leakage current in the PN junction. FIGS. 8B-8D illustrate relationships between the dose amount of Ar ions and the size of the crystal defect in the lattice distortion layer 4.

As shown in FIG. 8A, when the dose amount of Ar ions is zero and $1 \times 10^{14}$ cm$^{-2}$, the leakage current in the PN junction does not occur. However, when the dose amount of Ar ions is $3 \times 10^{14}$ cm$_{-2}$ and $1 \times 10^{15}$ cm$^{-2}$, the leakage current in the PN junction occurs. As shown in FIG. 8B, when the dose amount is $1 \times 10^{14}$ cm$^{-2}$, the average diameter of the crystal defect is about 5 nm. As shown in FIG. 8C, when the dose amount is $3 \times 10^{14}$ cm$^{-2}$, the average diameter of the crystal defect is greater than 15 nm. As shown in FIG. 8D, when the dose amount is $1 \times 10^{15}$ cm$^{-2}$, the average diameter of the crystal defect is greater than 15 nm. As shown in FIGS. 8C, 8D, when the average diameter of the crystal defect exceeds 15 nm, dislocation occurs.

Therefore, it can be considered that occurrence of the leakage current can be prevented when the diameter of the crystal defect is less than a diameter causing dislocation, for example, 15 nm.

Further, in order to study a detail relationship between the dose amount of the implanted Ar ions and the crystal defect, a relationship between a wavelength λ and emission intensity was measured by cathodoluminescence (CL) analysis while changing the dose amount of Ar ions. This relationship is shown in FIGS. 9A-9E.

FIGS. 9A-9E show the relationship observed when the dose amount is $5 \times 10^{12}$ cm$^{-2}$, $3 \times 10^{13}$ cm$^{-2}$, $1 \times 10^{14}$ cm$^{-2}$, and $3 \times 10^{14}$ cm$^{-2}$, respectively. In the figures, a D1 line (λ=1535 nm) corresponds to a wavelength at which emission occurs due to dislocation, a T0 line corresponds to a wavelength (λ=1130 nm) at which emission occurs due to a typical silicon atom forming Si—Si bonds, and a Gcenter line corresponds to a wavelength (λ=1279 nm) at which emission occurs due an unbonded silicon atom in a silicon lattice.

As can be seen from FIGS. 9A-9E, when the dose amount of Ar ions is small, the emission intensity (hereinafter called the "D1 line peak intensity") at the D1 line is small and does not peak. However, when the dose amount of Ar ions is increased to $3 \times 10^{14}$ cm$^{-2}$, the D1 line peak intensity becomes large. This means that dislocation occurred as a result of the increase in the dose amount of Ar ions. In other words, it can be considered that when the D1 line peak intensity is smaller than a given value, dislocation will hardly occur. Therefore, the dose amount of the Ar ions needs to be adjusted to satisfy this.

However, since the emission intensity varies depending on measuring conditions, whether or not the D1 line peak intensity will affect the leakage current cannot be determined by just taking into consideration the D1 line peak intensity. Therefore, a ratio of the D1 line peak intensity to the emission intensity (hereinafter called the "T0 line peak intensity") at the T0 line is calculated so that the D1 line peak value can be a relative value. In such an approach, it was confirmed that when this ratio is equal to or less than 1/3, the effect of dislocation is small enough to reduce the leakage current. Therefore, the leakage current can be reduced by adjusting the dose amount of Ar ions in such a manner that this ratio is equal to or less than 1/3.

It is noted that the leakage current occurs due to not only dislocation but also an unbonded silicon atom in a silicon lattice. As described above, the Gcenter line corresponds to the wavelength at which emission occurs due an unbonded silicon atom in a silicon lattice. Therefore, the leakage current can be more reduced by adjusting the emission intensity (hereinafter called the "Gcenter line peak intensity") at the Gcenter line in such a manner that the Gcenter line peak intensity is smaller than a given value.

However, since the Gcenter line peak intensity varies depending on measuring conditions, whether or not the Gcenter line peak intensity will affect the leakage current cannot be determined by just taking into consideration the Gcenter line peak intensity. Therefore, a ratio of the Gcenter line peak intensity to the T0 line peak intensity is calculated so that the Gcenter line peak intensity can be a relative value. In such an approach, it was confirmed that when this ratio is equal to or less than 5/7, the effect of dislocation is small enough to reduce the leakage current. Therefore, the leakage current can be reduced by adjusting the dose amount of Ar ions in such a manner that this ratio is equal to or less than 5/7.

For reference, a junction leakage current in the SOI structure semiconductor device was measured when a depletion layer at a PN junction reached the lattice distortion layer 4 serving as a gettering site. As a result, it was confirmed that the leakage current is smaller than $1 \times 10^{-8}$ A/mm$^2$ and sometimes smaller than $3 \times 10^{-9}$ A/mm$^2$.

As described above, according to the embodiment, the lattice distortion layer 4 is formed by implanting Ar ions into a silicon substrate that is formed into the active layer 3. In such an approach, the lattice distortion layer 4 can serve as a gettering site. Further, the dose amount of Ar ions is adjusted so that tensile stress at the lattice distortion layer 4 can be equal to or greater than 11 MPa and equal to or less than 27 Mpa. Therefore, the leakage current can be reduced while allowing the lattice distortion layer 4 to serve as a gettering site.

The crystal defect in the lattice distortion layer 4 is sized not to cause dislocation. For example, the dose amount of Ar ions can be adjusted so that the average diameter of the crystal defect can be 15 nm or less. Further, the dose amount of Ar ions can be adjusted by using cathodoluminescence method so that the ratio of the D1 line peak intensity to the T0 line peak intensity is 1/3 or less, more preferably, the ratio of the D1 line peak intensity to the Gcenter line peak intensity is 5/7 or less.

(Second Embodiment)

A second embodiment of the present invention is described. A difference between the first and second embodiments is in that an impurity diffusion region is formed in addition to the p-type well layer 5.

Figure 10:
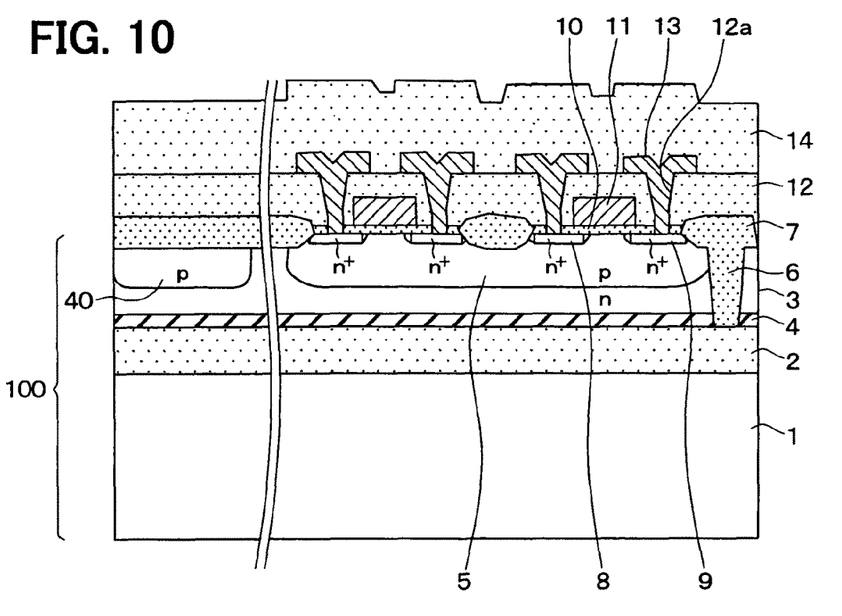
FIG. 10 is a cross-sectional view of a SOI structure semiconductor device according to a second embodiment of the present invention.

FIG. 10 is a cross-sectional view of a SOI structure semiconductor device according to the present embodiment. As shown in this figure, an impurity diffusion region 40 is formed in a non device-forming region around the device-forming region. Like the p-type well layer 5, p-type impurities are implanted and diffused in the impurity diffusion region 40. Specifically, boron is used as p-type impurities to from the impurity diffusion region 40.

The impurity diffusion region 40 in the non device-forming region can perform gettering of metal impurities, such as Fe, that are likely to be segregated into the boron diffusion region. Therefore, even when the lattice distortion layer 4 cannot perform gettering of all Fe impurities, the impurity diffusion region 40 can prevent Fe from being concentrated into the p-type well layer 5. Thus, the quality of the gate oxide film 10 on the p-type well layer 5 can be improved, and the junction leakage can be reduced.

The impurity diffusion region 40 can be formed by performing ion implantation and thermal diffusion of boron as p-type impurities after patterning a photoresist in a typical photolithography process. A manufacturing process can be simplified by forming the impurity diffusion region 40 at the same time as the p-type well layer 5. In this case, when the photoresist is patterned in the process shown in FIG. 3A, an opening is formed in the photoresist at a position corresponding to the impurity diffusion region 40. Then, ion implantation of boron is performed by using the photoresist as a mask so that bottom ions can be implanted into not only the position corresponding to the impurity diffusion region 40 but also the position corresponding to p-type well layer 5. Then, thermal treatment is performed, for example, in nitrogen atmosphere at a temperature of 1150° C. for 90 minutes so that the boron ions can be diffused. In this way, the impurity diffusion region 40 can be formed at the same time as the p-type well layer 5.

Alternatively, the p-type well layer 5 and the impurity diffusion region 40 can be formed in different processes. In this case, the dose amount of boron can be adjusted in such a manner that an impurity concentration of the impurity diffusion region 40 can be greater than an impurity concentration of the p-type well layer 5. For example, the dose amount of boron can be adjusted so that the impurity concentration of boron in the impurity diffusion region can be $1 \times 10^{18}$ cm$^{-3}$ or more. In such an approach, the effect of gettering of metal impurities that are likely to be segregated into the boron diffusion region can be improved.

(Third Embodiment)

A third embodiment of the, present invention is described. A difference between the first and third embodiments is in that the p-type well layer 5 is removed.

Figure 11:
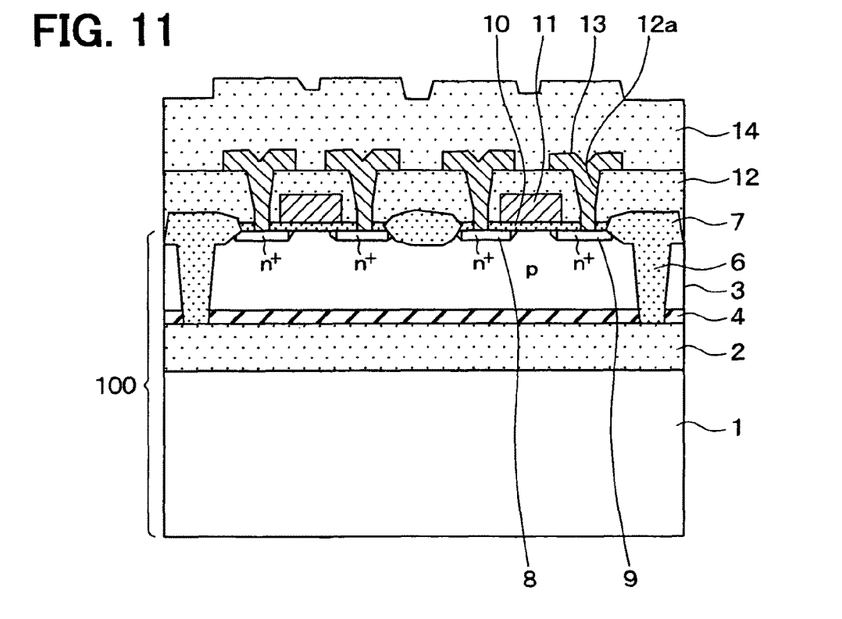
FIG. 11 is a cross-sectional view of a SOI structure semiconductor device according to a third embodiment of the present invention.

FIG. 11 is a cross-sectional view of a SOI structure semiconductor device according to the present embodiment. As shown in this figure, the active layer 3 is made of p-type monocrystalline silicon. The n$^+$-type source region 8 and the n$^+$-type drain region 9 are directly formed in the active layer 3. In such a structure, the active layer 3 forms a PN junction with the n$^+$-type source region 8 and the n$^+$-type drain region 9. Thus, a MOSFET with a PN junction is formed in the SOI structure semiconductor device.

Even in this structure, the same advantage as the first embodiment can be obtained by forming the lattice distortion layer 4 serving as a gettering site.

(Fourth Embodiment)

A fourth embodiment of the present invention is described. A difference between the first and fourth embodiments is in that the p-type well layer 5 is removed and the active layer 3 is thinned to provide a thin SOI structure.

Figure 12:
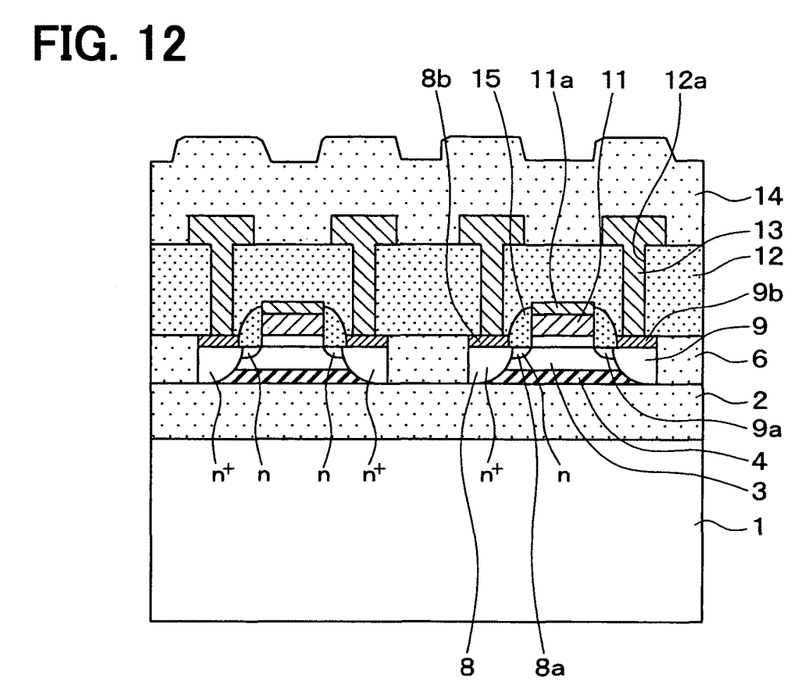
FIG. 12 is a cross-sectional view of a SOI structure semiconductor device according to a fourth embodiment of the present invention.

FIG. 12 is a cross-sectional view of a SOI structure semiconductor device according to the present embodiment. As shown in this figure, the active layer 3 is made of p-type monocrystalline silicon. The trench isolation structure 6 provides isolation of each device. The n$^+$-type source region 8 and the n$^+$-type drain region 9 are directly formed in the active layer 3. In such a structure, the active layer 3 forms a PN junction with the n$^+$-type source region 8 and the n$^+$-type drain region 9. Thus, a MOSFET with a PN junction is formed in the SOI structure semiconductor device.

Further, an electric field relieving layer 8a is located closer to a channel region than the n$^+$-type source region 8 and in contact with the n$^+$-type source region 8, and an electric field relieving layer 9a is located closer to the channel region than the n$^+$-type drain region 9 and in contact with the n$^+$-type drain region 9. A side wall of the gate electrode 11 is covered with a side wall 15 that is made of an insulation film such as an oxide film. Silicide films 8b, 9b, and 11a isolated by the side wall 15 are formed on surfaces of the n$^+$-type source region 8, the n$^+$-type drain region 9, and the gate electrode 11, so that a salicide structure can be formed. The n$^+$-type source region 8 and the n$^+$-type drain region 9 are electrically connected to each wire 13 via the silicide films 8b, 9b. The gate electrode 11 is electrically connected to a wire, which is not shown in the figure, via the silicide film 11a.

Even in this structure, the same advantage as the first embodiment can be obtained by forming the lattice distortion layer 4 serving as a gettering site.

(Other Embodiments)

According to the above-described embodiments, the manufacturing processes shown in FIGS. 2A-2F are described as an example of the manufacturing method of the SOI substrate 100. Alternatively, the SOI substrate 100 can be manufactured by any conventional method (for example, a method disclosed in JP-2000-332021A).

According to the above-described embodiments, a semiconductor device having a MOSFET is described as an example of the SOI structure semiconductor device with the p-type well layer 5. Alternatively, the SOI structure semiconductor device can have a device other than a MOSFET. For example, the SOI structure semiconductor device can have a bipolar transistor.

According to the above-described embodiments, the buried insulation layer 2 is formed with the thermally oxidized film 22. Alternatively, the buried insulation layer 2 can be formed with a film other than the thermally oxidized film 22. For example, the buried insulation layer 2 can be formed with a CVD film, a nitride film, or an ONO film.

According to the above-described embodiments, a n-type is defined as a first conductivity type, and a p-type is defined as a second conductivity type. Alternatively, a n-type can be defined as a second conductivity type, and a p-type can be defined as a first conductivity type.

According to the above-described embodiments, tensile stress is described as an example of internal stress occurring in the lattice distortion layer 4. The same holds true for when the internal force occurring in the lattice distortion layer 4 is compressive stress. The above-described expressions and the upper and lower limits of the internal stress can be applied to when the internal stress is compressive stress.

The invention claimed is:

1. A SOI structure semiconductor device comprising:
a SOI substrate including a silicon substrate of monocrystalline silicon, a first conductivity type active layer of monocrystalline silicon, and a buried insulation layer between the silicon substrate and the active layer; and
a second conductivity type layer located in a surface portion of the active layer to form a PN junction with the active layer, wherein
a silicon crystalline lattice of the active layer is distorted to form a lattice distortion layer serving as a gettering site.

2. The SOI structure semiconductor device according to claim 1, wherein
a thickness of the active layer is defined as X [μm],
a thickness of the buried insulation layer is defined as Y [μm], and
an internal stress in the lattice distortion layer satisfies the followings:
Internal stress [MPa]$\geqq$|−0.78X +22.8Y −18.5|.

3. The SOI structure semiconductor device according to claim 1, wherein
a thickness of the active layer is defined as X [μm],
a thickness of the buried insulation layer is defined as Y [μm], and
an internal stress in the lattice distortion layer satisfies the followings:
the internal stress [MPa]$\leqq$|−0.78X +22.8Y −34.5|.

4. The SOI structure semiconductor device according to claim 1, wherein
a thickness of the active layer is 5 μm,
a thickness of the buried insulation layer is 0.5 μm, and
an internal stress in the lattice distortion layer is equal to or greater than 11MPa.

5. The SOI structure semiconductor device according to claim 1 4, wherein
a thickness of the active layer is 5 μm,
a thickness of the buried insulation layer is 0.5 μm, and
an internal stress in the lattice distortion layer is equal to or less than 27MPa.

6. The SOI structure semiconductor device according to claim 1, wherein
when the lattice distortion layer is analyzed by a cathodoluminescence technique, a peak value of an emission intensity at a wavelength $\lambda$ of 1535 nm is defined as a D1 line peak intensity, and the peak value of the emission intensity at the wavelength $\lambda$ of 1130 nm is defined as a T0 line peak intensity, and
a ratio of the D1 line peak intensity to the T0 line peak intensity is equal to or less than 1/3.

7. The SOI structure semiconductor device according to claim 1, wherein
when the lattice distortion layer is analyzed by a cathodoluminescence technique, a peak value of an emission intensity at a wavelength $\lambda$ of 1279 nm is defined as a Gcenter line peak intensity, and the peak value of the emission intensity at the wavelength $\lambda$ of 1130 nm is defined as a T0 line peak intensity, and
a ratio of the Gcenter line peak intensity to the T0 line peak intensity is equal to or less than 5/7.

8. The SOI structure semiconductor device according to claim 1, wherein
an average diameter of a crystal defect in the lattice distortion layer is equal to or less than 15 nm.

9. The SOI structure semiconductor device according to claim 1, wherein
an average diameter of a crystal defect in the lattice distortion layer is greater than 0 nm and equal to or less than 15 nm.

10. The SOI structure semiconductor device according to claim 1, wherein
a second conductivity type well layer is located in an element forming region of the active layer, and
an impurity diffusion region where boron is diffused is located in a non-element forming region of the active layer in addition to the lattice distortion layer.

11. The SOI structure semiconductor device according to claim 10, wherein
when the well layer is of p-type, a p-type impurity concentration of the impurity diffusion region is greater than that of the well layer.

12. The SOI structure semiconductor device according to claim 10, wherein
a boron impurity concentration of the impurity diffusion region is equal to or greater than $1 \times 10^{18} cm^{-3}$.

13. A method of manufacturing the SOI structure semiconductor device according to claim 1, the method comprising:
forming a gate oxide film on a surface of the active layer;
performing a sacrifice oxidation before forming the gate oxide film, wherein
performing the sacrifice oxidation includes forming an oxide film by thermal oxidation and removing the oxide film formed by the thermal oxidation using a dilute HF.

* * * * *